(12) United States Patent
Garcia Vila et al.

(10) Patent No.: US 11,523,550 B2
(45) Date of Patent: Dec. 6, 2022

(54) ELECTRICAL ASSEMBLY ENCLOSURE

(71) Applicant: Lear Corporation, Southfield, MI (US)

(72) Inventors: Jordi Garcia Vila, Valls (ES); Xavier Carbonell Maté, Valls (ES); Jordi Claramunt Blanco, Valls (ES)

(73) Assignee: Lear Corporation, Southfield, MI (US)

( * ) Notice: Subject to any disclaimer, the term of this patent is extended or adjusted under 35 U.S.C. 154(b) by 0 days.

(21) Appl. No.: 16/595,708

(22) Filed: Oct. 8, 2019

(65) Prior Publication Data
US 2021/0105917 A1   Apr. 8, 2021

(51) Int. Cl.
| | |
|---|---|
| *G06F 1/16* | (2006.01) |
| *H05K 5/00* | (2006.01) |
| *H05K 7/00* | (2006.01) |
| *H05K 9/00* | (2006.01) |
| *H02J 7/00* | (2006.01) |

(52) U.S. Cl.
CPC .......... *H05K 9/0049* (2013.01); *H02J 7/0042* (2013.01); *H05K 5/0004* (2013.01); *H05K 9/0015* (2013.01)

(58) Field of Classification Search
CPC .. H05K 9/0015; H05K 9/0009; H05K 9/0037; H05K 9/0049; H05K 5/0095; H05K 5/0069; H05K 5/061
See application file for complete search history.

(56) References Cited

U.S. PATENT DOCUMENTS

| | | | |
|---|---|---|---|
| 6,078,155 A * | 6/2000 | Tominaga | B62D 5/0406 318/293 |
| 6,545,217 B2 * | 4/2003 | Sato | H02G 3/088 174/135 |
| 6,852,924 B2 * | 2/2005 | Lessard | H05K 9/0073 174/377 |
| 7,208,678 B2 * | 4/2007 | Shinmura | H05K 7/20927 174/17 R |
| 7,965,510 B2 | 6/2011 | Suzuki et al. | |
| 8,072,758 B2 * | 12/2011 | Groppo | H05K 7/20927 361/703 |
| 9,332,676 B2 | 5/2016 | Sharaf et al. | |
| 9,433,110 B2 * | 8/2016 | Schwab | H05K 5/0217 |
| 10,806,039 B2 * | 10/2020 | Maurech | H05K 5/0221 |
| 2010/0025126 A1 * | 2/2010 | Nakatsu | H02M 7/003 361/699 |
| 2010/0097765 A1 * | 4/2010 | Suzuki | B60K 6/405 361/699 |

(Continued)

FOREIGN PATENT DOCUMENTS

CN   108099681 A   6/2018

*Primary Examiner* — Anthony M Haughton
(74) *Attorney, Agent, or Firm* — Brooks Kushman P.C.

(57) ABSTRACT

An electrical assembly is provided with a housing cast from an aluminum material to shield from electromagnetic interference, with a cavity sized to retain electrical components, an opening, and a series of receptacles formed about a perimeter of the opening. A seal is oriented about the perimeter of the opening. A cover is formed from an aluminum sheet material to shield from electromagnetic interference and is sized to enclose the opening. A plurality of mechanical retainers is formed about a perimeter of the cover and sized to align with the series of receptacles, to be mechanically deformed into the series of receptacles to affix the cover to the housing.

16 Claims, 3 Drawing Sheets

(56) References Cited

U.S. PATENT DOCUMENTS

| | | | |
|---|---|---|---|
| 2011/0171856 A1* | 7/2011 | Tyler | H01R 13/443 |
| | | | 439/607.52 |
| 2013/0033098 A1* | 2/2013 | Nagashima | B60T 7/042 |
| | | | 361/752 |

* cited by examiner

ELECTRICAL ASSEMBLY ENCLOSURE

TECHNICAL FIELD

Various embodiments relate to electrical assembly enclosures such as an electrical assembly for vehicle electronics, such as an on-board vehicle battery charger.

BACKGROUND

On-board vehicle battery chargers conduct high current, which consequently generates an electromagnetic current. Electrical assembly enclosures often include a housing with a cavity and a cover that are sealed with a gasket and screws. The housing, cover, gasket and screws are often provided with electromagnetic current shielding.

SUMMARY

According to at least one embodiment, an electrical assembly is provided with a housing with a cavity sized to retain electrical components, and an opening to the cavity. A cover is sized to enclose the opening. A plurality of mechanical retainers is formed along a perimeter of the housing opening or the cover to be mechanically deformed into engagement with the housing or the cover to affix the cover to the housing.

According to a further embodiment, one of the housing and the cover is provided with a series of receptacles formed about the perimeter.

According to an even further embodiment, one of the housing and the cover is provided with a series of retainers formed about the perimeter and oriented to align with the series of receptacles to be deformed into the series of receptacles.

According to an even further embodiment, no threaded fasteners attach the cover to the housing.

According to another further embodiment, the housing is formed from a material that shields from electromagnetic interference.

According to an even further embodiment, the cover is formed from a material that shields from electromagnetic interference.

According to another further embodiment, the housing is formed from an aluminum material that shields from electromagnetic interference.

According to an even further embodiment, the cover is formed from an aluminum material that shields from electromagnetic interference.

According to another further embodiment, a seal is provided between the cover and the housing.

According to an even further embodiment, the housing and the cover shield from electromagnetic interference greater than the seal.

According to at least another embodiment, a method is provided for assembling an electrical assembly, by providing a housing with a cavity sized to retain electrical components, and an opening to the cavity. A cover is sized to enclose the opening. A plurality of mechanical retainers is formed along a perimeter of the housing opening or the cover to be mechanically deformed into engagement with the housing or the cover to affix the cover to the housing. Electrical components are installed in the housing cavity. The cover is placed on the opening of the housing. The mechanical retainers are deformed.

According to at least another embodiment, a method to enclose an electrical assembly provided a housing with a cavity. Electrical components are installed in the housing cavity. A cover is placed over the cavity of the housing. A plurality of mechanical retainers is deformed about a perimeter of the cover and the housing to affix the cover on the housing to enclose the cavity.

According to a further embodiment, the cover is pressed against the housing while deforming the plurality of mechanical retainers.

According to an even further embodiment, a seal is provided about the perimeter of the housing. The seal is partially compressed while the plurality of mechanical retainers is deformed.

According to another further embodiment, the housing is cast from an aluminum material that shields from electromagnetic interference.

According to an even further embodiment, the cover is formed from an aluminum material that shields from electromagnetic interference.

According to another even further embodiment, the housing is formed with a plurality of receptacles about the perimeter of the cavity. The cover is formed with the plurality of mechanical retainers about the perimeter aligned with the plurality of receptacles. The plurality of mechanical retainers is deformed into the plurality of receptacles.

According to at least another embodiment, an electrical assembly is assembled by a method to enclose the electrical assembly by providing a housing with a cavity. Electrical components are installed in the housing cavity. A cover is placed over the cavity of the housing. A plurality of mechanical retainers is deformed about a perimeter of the cover and the housing to affix the cover on the housing to enclose the cavity.

According to at least another embodiment, an electrical assembly is provided with a housing cast from an aluminum material to shield from electromagnetic interference, with a cavity sized to retain electrical components, an opening, and a series of receptacles formed about a perimeter of the opening. A seal is oriented about the perimeter of the opening. A cover is formed from an aluminum sheet material to shield from electromagnetic interference and is sized to enclose the opening. A plurality of mechanical retainers is formed about a perimeter of the cover and sized to align with the series of receptacles, to be mechanically deformed into the series of receptacles to affix the cover to the housing.

According to a further embodiment, no threaded fasteners attach the cover to the housing. The seal does not shield from electromagnetic interference.

DETAILED DESCRIPTION

As required, detailed embodiments of the present invention are disclosed herein; however, it is to be understood that the disclosed embodiments are merely exemplary of the invention that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present invention.

On-board vehicle battery chargers conduct high current, which consequently generates an electromagnetic current (EMC). Electrical assembly enclosures often include a housing with a cavity and a cover that are sealed with a gasket and screws. The housing, cover, gasket and screws are often provided with EMC shielding to shield other components from EMC generated from the onboard vehicle charger. The assembly process with multiple screws can be time-consuming and adds cost for the screws. An electrical assembly enclosure with multiple screws may lead to tampering or failures. Over-torque of a fastener can result in breakage of the fluid vessel. Under-torque of a fastener can result in leakage of the fluid vessel. In order to maintain EMC shielding at the gasket, a specific gasket material is employed to seal the enclosure and to shield the seal.

Figure 1:
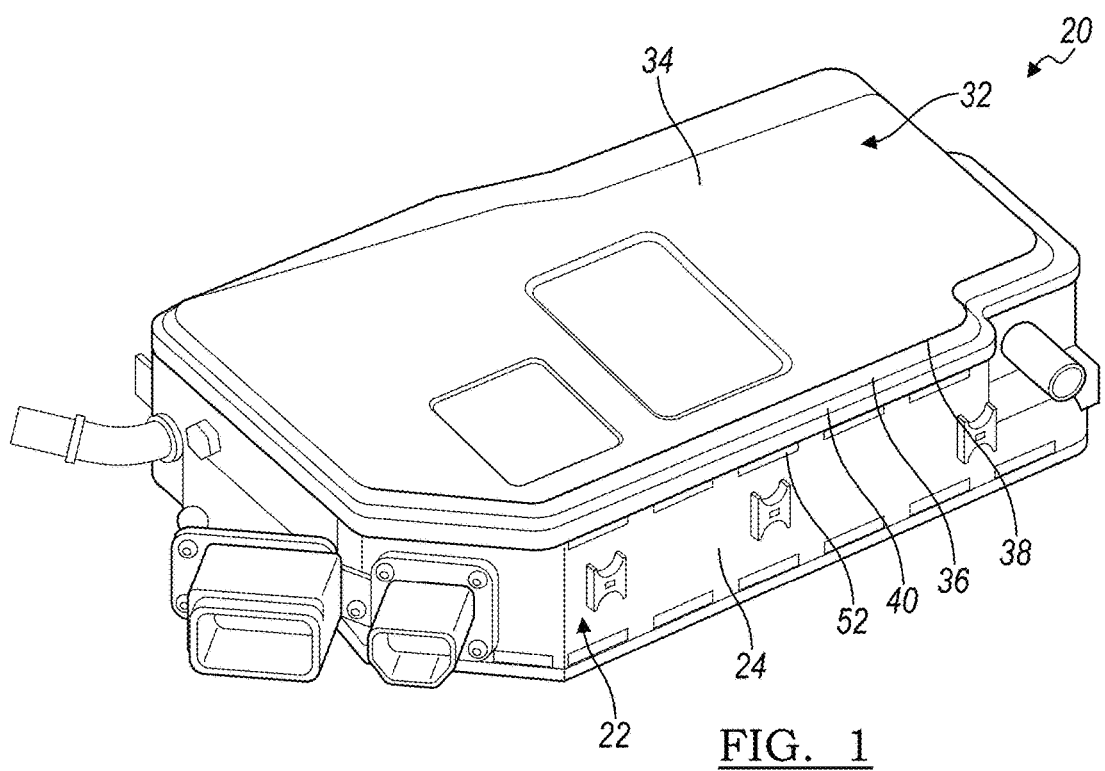
FIG. 1 is a front perspective view of an onboard vehicle charger according to an embodiment.
Figure 2:
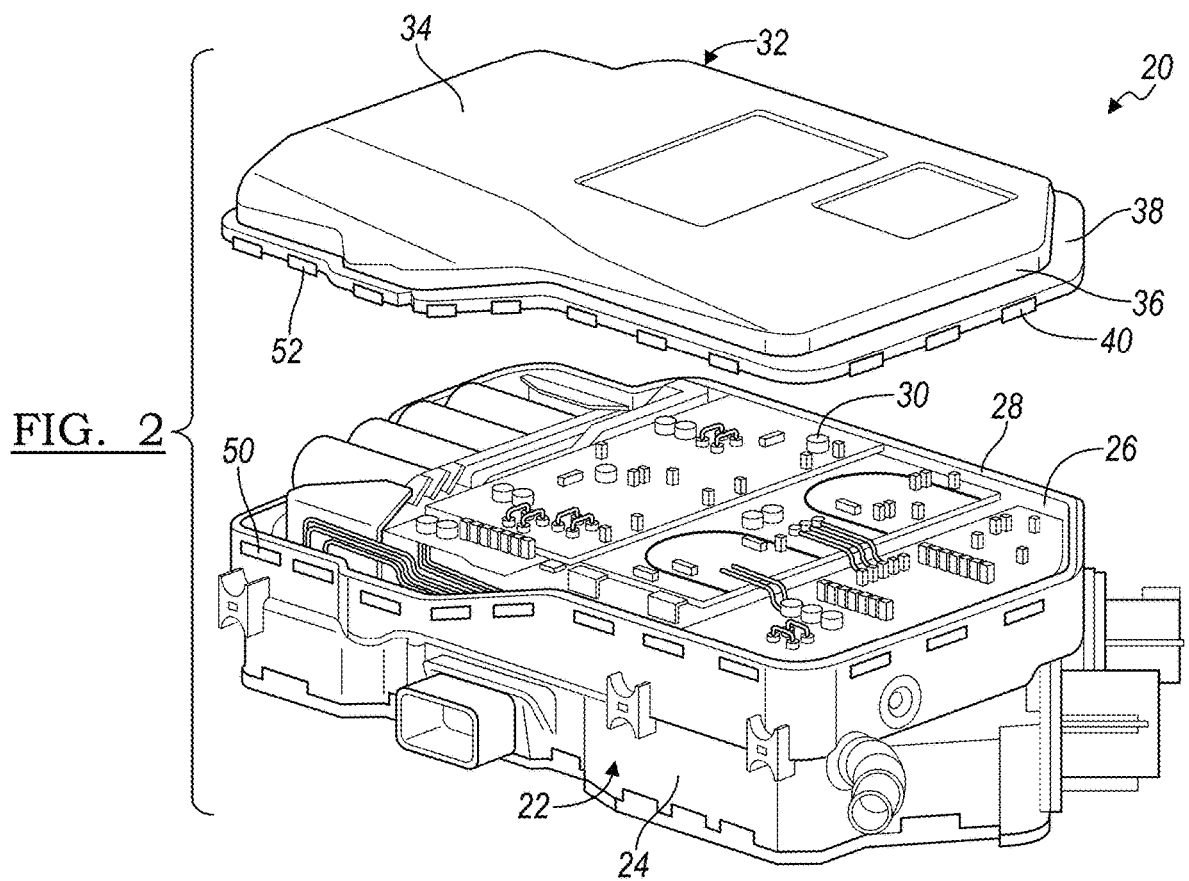
FIG. 2 is an exploded perspective view of the onboard vehicle charger of FIG. 1.

FIGS. 1 and 2 illustrate an electrical assembly 20 according to an embodiment. The electrical assembly 20 is depicted as an onboard vehicle charger (OBC) 20. Although the OBC 20 is illustrated, any electrical assembly that shields sealed electronic components may employ the shielding of the electrical assembly 20, such as closed housing main covers, printed circuit boards, internal frames, converters, batteries, telecommunications, or any shielded electrical device.

The electrical assembly 20 includes a housing 22 with a plurality of sidewalls 24 defining a cavity 26 within the housing 22. The housing 22 is formed from die-cast aluminum, which provides structural integrity, high thermal conductivity for heat transfer, while also being a material that shields EMC. The sidewalls 24 terminate at a peripheral opening 28 to the cavity 26. With reference to FIG. 2, the housing 22 includes a plurality of electrical components 30 stored within the cavity 26.

Figure 3:
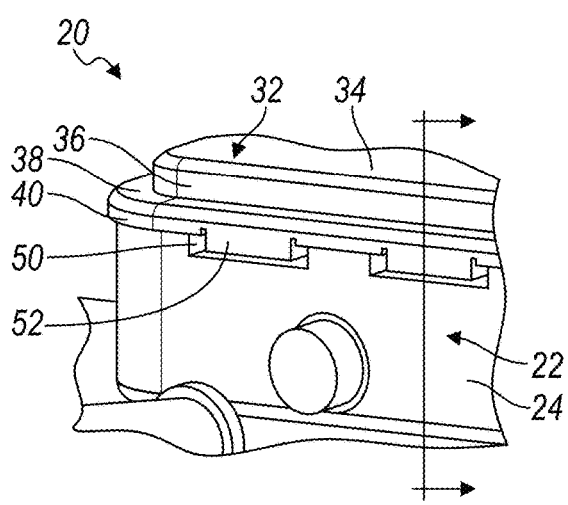
FIG. 3 is an enlarged side perspective view of a portion of the onboard vehicle charger of FIG. 1.

The electrical assembly 20 also includes a cover 32 sized to mate with the housing 22 and cover the opening 28 to enclose the cavity 26. The cover 32 of at least one embodiment, is stamped from an aluminum-magnesium alloy, which has properties to shield the EMC. Referring to FIGS. 1-3, the cover 32 has a primary body 34 stamped as a substrate, which forms part of the cavity 26 with the housing 22. The cover 32 includes a sidewall 36 extending from the substrate 34 and extending outward at a lid 38 to engage the opening 28 of the housing 22. A flange 40 extends from the lid 38 to enclose a distal perimeter of the sidewalls 24 of the housing 22.

The enclosed housing 22 with the cover 32 act as a shield, also referred to as a Faraday cage, for the electronic components inside the housing 22 and the cover 32. Electromagnetic interference is received or emitted. In other words, electromagnetic interference is not conducted through the housing 22 and the cover 32, because the walls 24 of the housing 22, and the cover 32 act as electromagnetic shields. Internal and external electromagnetic fields generate a charge distribution in surfaces of the housing 22 and the cover 32, which generate a capacitive effect in the system. The housing 22 has a direct electrical connection to an electrical ground (such as a vehicle chassis) to isolate the inside of the housing 22 and the cover 32 from outside of the housing 22 and the cover 32 for electromagnetic compliance.

Figure 4:
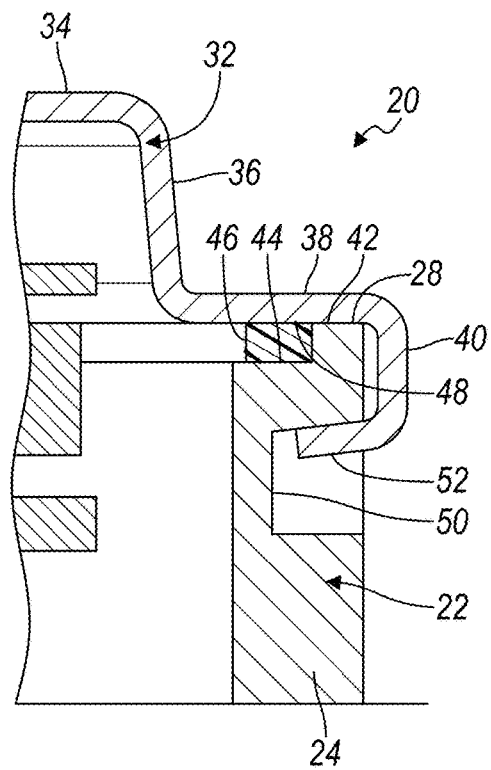
FIG. 4 is a partial section view of the portion of the onboard vehicle charger taken along a section line in FIG. 3, according to an embodiment.

With reference now to FIG. 4, the sidewalls 24 of the housing terminate at a mating surface 42 to define the opening 28 of the cavity 26. The mating surface 42 may be machined within applicable tolerances to provide a flatness to receive the cover 32. A recess 44 is formed in the sidewall 24 beneath the mating surface 42 to receive a seal 46. The seal 46 may be a sealant, gasket, paste, rubber or the like. The lid 38 of the cover 32 provides a mating surface 48 to engage the housing mating surface 42. The cover mating surface 48 also engages the seal 46 to compress the seal 46 and thereby seal the intersection of the housing 22 and the cover 32. The seal 46 provides a water-tight connection to prevent water or other debris from entering the cavity 26.

Referring now to FIGS. 2-4, a plurality of receptacles 50 are formed laterally into the sidewalls 24 about a perimeter of the housing opening 28. The receptacles 50 are spaced incrementally. The receptacles 50 are elongate along the perimeter, with a blind depth and a limited height. The receptacles 50 may be cast or machined into the housing 22; or the receptacles can be partially cast into the housing 22, and then machined to tolerances.

Now with reference to FIGS. 1-4, the cover 32 includes a series of mechanical retainers, or flaps 52 formed about the perimeter and extending from the flange 40. The flaps 52 are spaced incrementally in alignment with the receptacles 50. The flaps 52 are oriented parallel with the flange 40 prior to assembly as illustrated in FIGS. 2 and 3. Once the cover 32 is placed upon the housing 22 as illustrated in FIG. 3, the cover 32 is pressed toward the housing 22 to compress the seal 46. Then the flaps 52 are clinched, or plastically deformed, into the receptacles 50 to affix the cover 32 to the housing 22 as illustrated in FIG. 4. Alternatively, the housing 22 could include the flaps 52, whereby the cover 32 could include the receptacles 50. The flaps 52 are bent into the receptacles 50 to engage the receptacles 50 and prevent disassembly of the cover 32 from the housing 22.

The flaps 52 maintain a compression of the seal 46 of about thirty percent to maintain the integrity of the enclosure. The seal 46 is covered by the lid 38 and the flange 40 of the cover 32. Since the seal 46 is not exposed, the seal 46 is not made of an EMC shielding material, thereby eliminating cost. For example, the aluminum of the housing 22 and the cover 32 shields from electromagnetic interference greater than the seal 46.

Additionally, the cover 32 is in electrical contact with the housing 22 to provide a consistent EMC shield. By removing threaded fasteners from the connection of the cover 32 to the housing 22, no additional EMC shielding of fasteners is required. Additionally, the number of parts is minimized, while simplifying the assembly process. The flaps 52 are tamper proof and are unlikely to unfasten from exposure to varying temperatures and vibrations.

Figure 5:
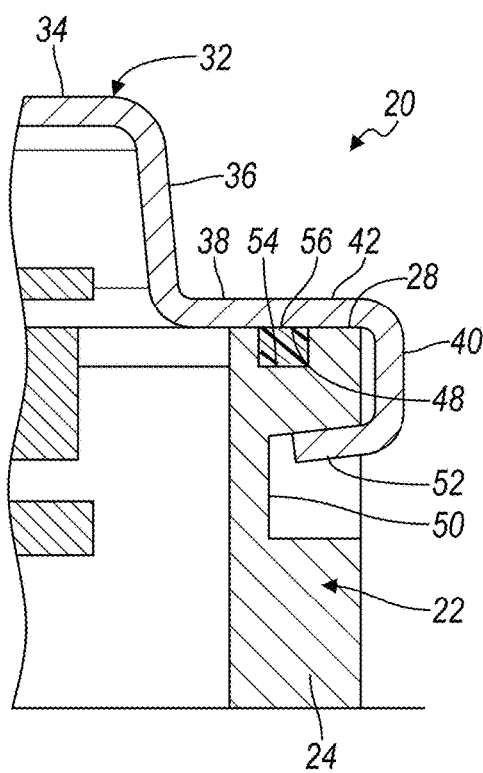
FIG. 5 is a partial section view of the portion of the onboard vehicle charger taken along the section line in FIG. 3, according to another embodiment.

FIG. 5 illustrates the OBC 20 according to another embodiment. A groove 54 is formed into the mating surface 42 of the housing 22. A seal 56 is disposed within the groove 54. The seal 56 may be formed from a sealant, gasket, paste, rubber, or the like.

Figure 6:
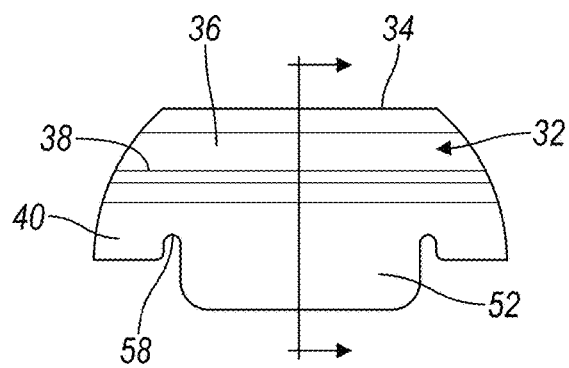
FIG. 6 is an enlarged side elevation view of a mechanical retainer of the onboard vehicle charge of FIG. 1.
Figure 7:
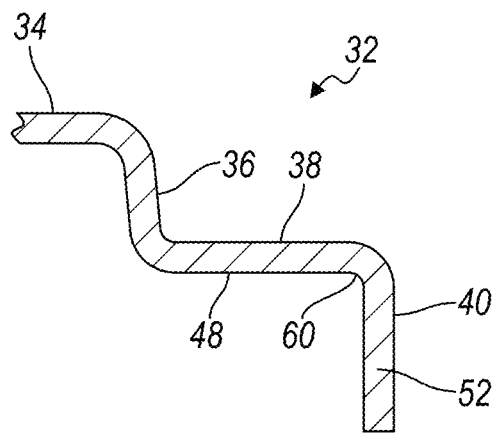
FIG. 7 is a section view of the mechanical retainer taken along the section line in FIG. 6.

FIGS. 6 and 7 illustrate the flap 52 enlarged in greater detail. In one embodiment, the flap 52 and the cover are formed unitary from stamped metal with a thickness of approximately one millimeter. A notch 58 is formed in the flange 40 on each lateral side of the flap 52 to permit deformation of the flap 52 during clinching without deforming the flange 40. A minimal radius 60 (FIG. 7) is formed at the intersection of the flange 40 and the lid 38 to maximize contact between the cover 32 and the housing 22.

Figure 8:
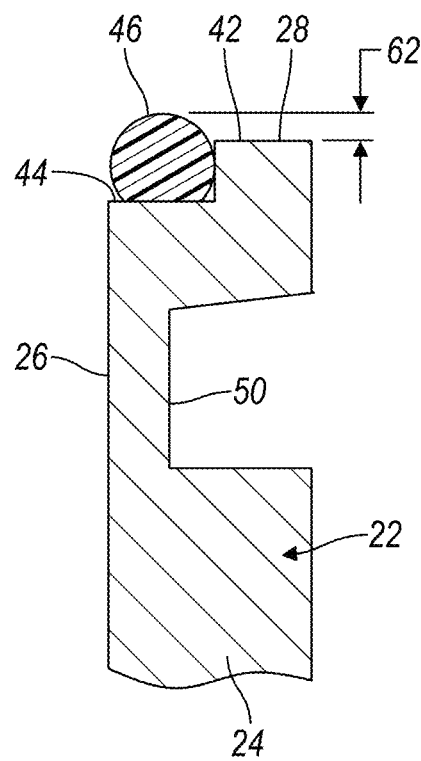
FIG. 8 is a partial section view of the portion of the onboard vehicle charger taken along the section line in FIG. 3, according to another embodiment.

FIG. 8 illustrates the seal 46 unloaded from the cover 32. By way of example, the recess 44 is formed 1.5 millimeters deep and three millimeters wide. The seal 46 has a width of 2.5 millimeters. The seal 46 also has a height to exceed the depth of the recess 44 by an offset 62 of 0.7 millimeters to engage the mating surface 48 of the cover 32.

Figure 9:
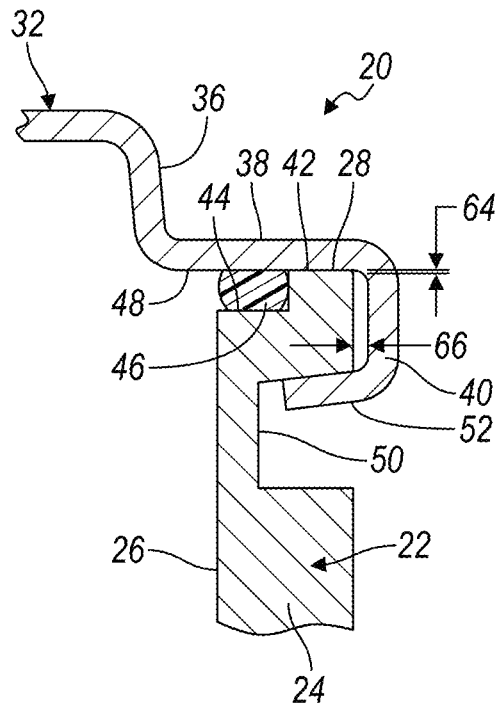
FIG. 9 is a partial section view of the portion of the onboard vehicle charger taken along the section line in FIG. 3, according to an embodiment.

FIG. 9 illustrates the housing 22 and the seal 46 in engagement with the cover 32. A clearance 64 between the mating surface 42 of the housing 22 and the mating surface 48 of the cover 32 is minimized to maintain electrical contact between the cover 32 and the housing 22. Likewise, a gap 66 is minimized between the flap 52 and the sidewall 24 of the housing 22.

While various embodiments are described above, it is not intended that these embodiments describe all possible forms of the invention. Rather, the words used in the specification are words of description rather than limitation, and it is understood that various changes may be made without departing from the spirit and scope of the invention. Additionally, the features of various implementing embodiments may be combined to form further embodiments of the invention.

What is claimed is:

1. An electrical assembly comprising:
   a housing with a cavity sized to retain electrical components, and an opening to the cavity;
   wherein the housing is formed from a material that shields from electromagnetic interference;
   a cover sized to enclose the opening;
   wherein the cover is formed from a material that shields from electromagnetic interference;
   a plurality of mechanical retainers formed along a perimeter of the housing opening or the cover to be mechanically, plastically deformed into engagement with the housing or the cover to affix the cover to the housing so that the plurality of mechanical retainers is tamper proof and to avoid inadvertent disassembly of the cover from the housing; and
   a seal provided between the cover and the housing;
   wherein the cover further comprises:
      a lid to engage the opening of the housing, and
      a flange extending from the lid to enclose the seal and a distal perimeter of the housing and to shield the seal from electromagnetic interference; and
   wherein the plurality of mechanical retainers extends from the flange.

2. The electrical assembly of claim 1 wherein one of the housing and the cover is provided with a series of receptacles formed about the perimeter.

3. The electrical assembly of claim 2, wherein the series of receptacles are formed laterally around the perimeter of the housing and are spaced incrementally.

4. The electrical assembly of claim 2, wherein the series of receptacles have a blind depth and a limited height.

5. The electrical assembly of claim 2 wherein one of the housing and the cover is provided with a series of retainers formed about the perimeter and oriented to align with the series of receptacles to be deformed into the series of receptacles.

6. The electrical assembly of claim 5 wherein no threaded fasteners attach the cover to the housing.

7. The electrical assembly of claim 1 wherein the housing is formed from an aluminum material that shields from electromagnetic interference; and
   wherein the cover is formed from an aluminum material that shields from electromagnetic interference.

8. The electrical assembly of claim 1 wherein the cover and the housing shield from electromagnetic interference greater than the seal.

9. The electrical assembly of claim 1
   wherein a notch is formed in the flange on each lateral side of each of the plurality of mechanical retainers to permit deformation of each of each of the plurality of mechanical retainers without deforming the flange.

10. A method for assembling the electrical assembly of claim 1 comprising:
    providing the housing;
    installing electrical components in the housing cavity;
    placing the cover on the opening of the housing; and
    plastically deforming the mechanical retainers.

11. The method of claim 10 further comprising:
    providing the seal about the perimeter of the housing; and
    pressing the cover against the housing to partially compress the seal while deforming the plurality of mechanical retainers.

12. The method of claim 10 further comprising:
    casting the housing from an aluminum material that shields from electromagnetic interference; and
    forming the cover from an aluminum material that shields from electromagnetic interference.

13. The method of claim 12 further comprising:
    forming the housing with a plurality of receptacles about the perimeter of the cavity;
    forming the cover with the plurality of mechanical retainers about the perimeter aligned with the plurality of receptacles; and
    deforming the plurality of mechanical retainers into the plurality of receptacles.

14. An electrical assembly assembled by the method of claim 10.

15. An electrical assembly comprising:
    a housing cast from an aluminum material that shields from electromagnetic interference, with a cavity, an opening, and a series of receptacles formed laterally about a perimeter of the opening to a blind depth;
    electrical components housed within the cavity;
    a seal oriented about the perimeter of the opening;
    a cover formed from an aluminum sheet material that shields from electromagnetic interference, and sized to enclose the opening and the seal to shield the seal from electromagnetic interference; and
    a plurality of mechanical retainers formed about a perimeter of the cover and sized to align with the series of receptacles, to be mechanically deformed into the series of receptacles to affix and retain the cover to the housing; and
    wherein the plurality of mechanical retainers is plastically deformed into the series of receptacles to affix and retain the cover to the housing so that the plurality of mechanical retainers is tamper proof and to avoid inadvertent disassembly of the cover from the housing.

16. The electrical assembly of claim 15, wherein the electrical components comprise an onboard vehicle charger;
   wherein no threaded fasteners attach the cover to the housing; and
   wherein the seal does not shield from electromagnetic interference.

\* \* \* \* \*